United States Patent [19]
Chance et al.

[11] Patent Number: 5,147,484
[45] Date of Patent: Sep. 15, 1992

[54] METHOD FOR PRODUCING MULTI-LAYER CERAMIC SUBSTRATES WITH OXIDATION RESISTANT METALIZATION

[75] Inventors: Dudley A. Chance, Newton, Conn.; Gareth G. Hougham, Ossining; David B. Goland, Bedford Hills, both of N.Y.

[73] Assignee: International Business Machines Corporation, Armonk, N.Y.

[21] Appl. No.: 683,397

[22] Filed: Apr. 10, 1991

Related U.S. Application Data

[60] Division of Ser. No. 296,290, Jan. 10, 1989, abandoned, which is a continuation of Ser. No. 110,246, Oct. 19, 1987, abandoned.

[51] Int. Cl.$^5$ .............................................. C04B 37/00
[52] U.S. Cl. ........................................ 156/89; 264/61; 264/63
[58] Field of Search ............... 156/89; 252/518; 264/61, 63, 66

[56] References Cited

U.S. PATENT DOCUMENTS

| | | | |
|---|---|---|---|
| 3,650,825 | 3/1972 | Lihl | 117/217 |
| 3,987,480 | 10/1976 | Diguet et al. | 357/65 |
| 4,079,156 | 3/1978 | Youtsey et al. | 427/96 |
| 4,234,367 | 10/1980 | Herron et al. | 156/89 |
| 4,301,324 | 11/1981 | Kumar et al. | 174/68.5 |
| 4,413,061 | 11/1983 | Kumar et al. | 501/7 |
| 4,504,339 | 4/1985 | Kamehara et al. | 156/89 |
| 4,561,009 | 12/1985 | Yonezawa et al. | 357/67 |
| 4,885,038 | 12/1989 | Anderson, Jr. et al. | 156/89 |

FOREIGN PATENT DOCUMENTS

| | | |
|---|---|---|
| 0098067 | 6/1983 | European Pat. Off. |
| 0163548 | 5/1985 | European Pat. Off. |
| 0211619 | 7/1986 | European Pat. Off. |
| 0217176 | 9/1986 | Fed. Rep. of Germany |
| 0214916 | 7/1986 | France |
| 58-103313 | 10/1983 | Japan |

OTHER PUBLICATIONS

"Corrosive Resistant Aluminum-Copper Alloys", P. Farrar et al., IBM TDB vol. 13, No. 8, Jan. 1971, p. 2125.

Jap Publication J55107-257 (Abstract Only).

"Prevention of Corrosion of Copper by Ion Implantation", B. L. Crowder et al. IBM TDB vol. 14, No. 1, Jun. 1971, p. 198.

Primary Examiner—James Lowe
Assistant Examiner—Christopher A. Fiorilla
Attorney, Agent, or Firm—Daniel P. Morris

[57] ABSTRACT

Ceramic substrates and a method for forming the ceramic substrates containing multi-level and interconnected circuit patterns of copper based conductors which are resistant to oxidation, said formation includes burn-out of binders in air. The oxidation resistant copper based conductors are composed primarily of copper and additives such as zinc, platinum and chrome.

18 Claims, 1 Drawing Sheet

METHOD FOR PRODUCING MULTI-LAYER CERAMIC SUBSTRATES WITH OXIDATION RESISTANT METALIZATION

This is a division of application Ser. No. 07/296,290, filed Jan. 10, 1989, now abandoned, which was a continuation of application Ser. No. 07/110,246, filed on Oct. 19, 1987, now abandoned.

DESCRIPTION

1. Technical Field

The present invention relates to a method of providing metal conductors resistant to oxidation during burn-out of binders in the fabrication of ceramic substrates containing such conductors therein. These substrates are useful as circuit substrates on which semiconductor chips, provided with very large scale integrated circuits, are electrically mounted.

2. DESCRIPTION OF THE PRIOR ART

Multi-layered ceramic circuit substrates contain patterned metal layers which act as electrical conductors sandwiched between ceramic layers which act as electrical insulators. These ceramic substrates are formed by laminating together thin green sheets of glass particles or an admixture of glass and crystalline particles mixed with binders and patterns of paste containing metal particles mixed with binders for forming conductors between the ceramic greensheet. This green laminate is fired to burn off the binder materials, fired to coalesce the particles to a dense state further fired if necessary to crystallize the densified glass particles or to further crystallize the admixture of glass and crystalline particles to form an insulator and to coalesce the metal particles to form conducting metal lines.

Terms such as ceramic and glass ceramic are often used interchangeably in the art. To avoid confusion for the purpose of this application the following definitions will be used. The term ceramic has the following meaning: an aggregate of randomly oriented crystallites wherein the interstices between crystallites may contain uncrystallized material such as a glass. The terms coalescence or densification refer to a heat treatment to reduce the density of pores in greensheets. The term crystallization refers to further heating after coalescence or densification or heating if there is no coalescence or densification step, to form crystallites from a glass. The term sintering refers to the heat treatment required to form the final ceramic. Sintering of a greensheet of crystallizable glass particles is a heat treatment to coalesce or densify the greensheet plus the heat treatment to form crystallites from the glass. Sintering of a greensheet of an admixture of glass particles and crystalline particles is a heat treatment to coalesce or densify the greensheet plus a crystallizing heat treatment only if further crystallization is required. The term sintering temperature means, for a green sheet requiring crystallization, the crystallization temperature. The term sintering temperature means, for a greensheet not requiring crystallization, the coalescence temperature.

Substrates made of ceramics requiring high temperatures for particle coalescence and densification, such as alumina, restrict the choice of co-sinterable conducting metallurgies to high melting point metals, for example refractory metals, such as molybdenum, tungsten, platinum, palladium or a combination of these with each other or certain other metals and precludes the use of good electrical conductors such as gold, silver and copper which have melting points less than the alumina sintering temperature. Alumina is a good insulator, has high thermal conductivity and has good strength. However, it is disadvantageous with respect to its dielectric constant and its thermal coefficients of expansion. The relatively high dielectric constant of alumina, about 10, results in unacceptable electrical signal delays since the pulse propagation speed on the transmission line formed by metal conductors embedded in the dielectric material of the substrate is inversely proportional to the square root of the material dielectric constant. The higher thermal coefficient of expansion of alumina, compared to silicon, results in sheer stress in the solder joints electrically and mechanically connecting device and circuit elements on the chip to the substrate.

Materials often referred to as glass-ceramics have been intensively studied in recent years for use as circuit substrates. These ceramics generally have a low dielectric constant, a low thermal coefficient of expansion which is close in value to silicon and a low sintering temperature. The low sintering temperature permits the use of low melting point metals, such as copper and noble metals, for electrical conductors. Noble metals have low resistivies comparable to copper. However, copper is less expensive and therefore its use substantially reduces manufacturing cost. When copper is used as the electrical conductor, it is necessary that thermoplastic organic binder materials contained within the green sheet used to form the ceramic and contained within the paste used to form the copper conductors be depolymerized and burned out in an atmosphere and at a temperature wherein the copper is not substantially oxidized.

Failure to burn out binders results in less than desirable ceramic properties. For example, if the binder is not fully burned out, residual carbon is left in the sintered ceramic which modifies the ceramic dielectric constant and inhibits complete densification. With only 0.1% residual carbon content the ceramic may be black having an apparent dielectric constant greater than 1000 and, rather than being an insulator the fired ceramic will be a semiconductor.

Removal of the binder is complicated by the additional requirement that the burn-out ambient not oxidize the copper metal lines and planes. If the copper is oxidized, the copper oxide diffuses into the ceramic and changes the dielectric properties of the ceramic. Also, when copper is oxidized it expands causing stress within the green laminate which can result in delamination and cracking of the green laminate. Such cracks may not be removed by the sintering heat treatment there by resulting in a ceramic weakend by cracks.

Two references generally describing binder burn-out and the fabrication of ceramics are U.S. Pat. No. 4,234,367 to Herron et al. and U.S. Pat. No. 4,504,339 to Kamehara et al.

Herron et al. U.S. Pat. No. 4,234,367 describes a method for forming sintered ceramic substrates containing multilevel, interconnected circuit patterns of copper-based conductor films obtained by heating the green laminate composed of particles of crystallizable glass in an ambient of hydrogen and water to a burn-out temperature of about 700° C. to 800° C. at a rate of 1° C. to 3° C. per minute. A lower burn-out temperature would take a prohibitively excessive amount of time for carbon removal. The binder burn-out time is about 11 hours as is apparent from FIG. 4 of the Herron et al. patent. This long time is needed: 1) to avoid bloating of the ceramic article caused by entrapped volatile products which cause the article to expand instead of contracting on sintering, 2) to fully oxidize carbon in the binders, 3) to avoid drastic volume changes in the copper conductor resulting from the copper-oxide formation, and 4) to reduce any copper-oxide formed on the conductors to copper. After the binder is burned out the laminate is sintered to form the ceramic material by first heating to coalesce the laminate to a dense state and thereafter heating to form crystals from the densified glass particles.

U.S. Pat. No. 4,504,339 to Kamehara et al. describes a method for forming sintered ceramic substrates containing multilevel, interconnected circuit patterns of copper-based conductor films from a green laminate composed of an admixture particles of glass and particles of crystallites. Binders are burned-out by firing the substrate in a controlled ambient of an inert atmosphere, e.g. nitrogen, containing water vapor at a partial pressure from 0.005 to 0.3 atmospheres at a temperature between 550° C and 650° C for a time sufficient to burn out the binders in the green laminate and thereafter raising the temperature in an inert atmosphere without water to the sintering temperature to coalesce the green laminate to form the ceramic. The binder burn-out time is about 8 hours as is apparent from FIG. 2 of the Kamehara et al. patent. The burn-out temperature upper bound is limited to 650° C because if the burn-out temperature used were higher, the glass components of the green sheets would begin to coalesce hindering further binder removal.

Both the patent to Kamehara et al. and the patent to Herron et al. teach increasing the burn-out temperature to increase the burn-out rate. In the present invention it is an object to achieve an increased burn-out rate without the necessity of a higher temperature as required by the methods of the prior art.

A method of the present invention forms sintered ceramic substrates containing multilevel, interconnected circuit patterns of copper-based conductor films obtained by first firing in air at a temperature between about 450° C and 600° C to burn-out binders. The binder burn-out time is about 1 to 4 hours in contrast with the very long burn-out times required in the prior art. The binders are more efficiently burned out in an atmosphere of air than in the prior at atmospheres. The temperature is then raised in an inert or reducing atmosphere to the ceramic sintering temperature.

Providing more rapid binder burn-out is another object of the present invention, as is the provision of binder burn-out in an air atmosphere, rather than in a special atmosphere. The prior art does not teach or suggest binder burn-out in air. Avoiding the required special atmosphere of the prior art by using air for binder burn-out results in a substantially less complex and less costly process for ceramic circuit substrate fabrication.

By a method of the present invention binders are burned out at a temperature of about 450° C. to 600° C. which is substantially less than the temperature range of 700° C. to 800° C. described in the Herron et al. patent. The burn-out temperature of the Kamehara et al. patent is approximately the same as the burn-out temperature of the present invention. However, by a method of the present invention the binder is burned-out in a fraction of the time required by the method of both patents.

While parameters such as temperature, time and atmosphere are important in an improved burn-out process, other considerations must also be observed if a ceramic having metal conductors therein is used as an integrated circuit substrate. These other considerations include the following requirements: first, the embedded conducting lines must have a resistivity which is not greater than the resistivity of a material such as molybdenum which has a resistivity about three times the resistivity of substantially pure copper. The resistivity of molybdenum is marginal for state of the art multi-layered ceramic substrates, especially for high performance applications. Fine lines of molybdenun are too resistive for low loss transmission lines and voltage planes of molybdenum are too resistive for the high currents required in the power distribution system. Second, any oxidation of the embedded conductors must not be great enough to disturb the green laminate. Oxide formation at a conductor surface causes volume expansion of the oxidized material resulting in stress which can cause delamination and cracking of the green laminate. Third, any change in the dielectric constant of the ceramic caused by interdiffusion of metal oxide in the ceramic must be limited to maintain the dielectric constant to a value less than the dielectric constant of alumina which is about 10.

It has been found, quite unexpectedly, that all these requirements can be met while burning out binders in air by including a selected additive to a copper based metallurgy which forms the conductor pattern within the ceramic substrate. Examples of additives satisfying these requirements are zinc, platinum and chrome. Zinc from between about 3% to about 25% by weight is particularly unique in permitting rapid binder burn-out in air.

Known prior art does not teach or suggest including an additive in copper conductors embedded in a ceramic substrate. It is acknowledged that the use of additives for corrosion resistance is taught in the semiconductor art. P. Farrar et al. in "Corrosion Resistant Aluminum-Copper Alloys" IBM Technical Disclosure Bulletin Vol. 13, No. 8, pp. 2125 (Jan. 1971) describes alloys which provide corrosion resistant conductors useful in semiconductor device manufacturing. Small amounts of material are added to aluminum-copper alloys to increase the corrosion resistance of the alloy. Zinc is an example of a material which is added in an amount less than 1% by weight. This article neither teaches nor suggest alone or in combination with other prior art adding zinc to copper in any amount to avoid oxidation of copper-based conductors during the burn-out of binders in the fabrication of a ceramic substrate containing copper based conductors therein.

It is another object of the present invention to provide an improved method for producing a multi-layered ceramic structure with patterned copper-based layers as low electrical resistance conductors therein.

It is another object of the present invention to produce a multi-layered ceramic circuit substrate by firing in air a laminated unsintered green composite with copper-based metallurgy contained therein in which organic binder resins can be completely burned out in air without leaving any carbonaceous residue in the ceramic insulator, without substantially oxidizing the copper-based metallurgy and without degrading the ceramic layers.

It is another object of the present invention to produce the improve multi-layered ceramic substrate by burning out binders in air by including an additive to the copper-based metallurgy contained therein.

It is another object of the present invention to provide a method of ceramic fabrication in which the binders can be burned out in air by including additives such as zinc, platinum and chrome to the copper-based metallurgy.

It is another object of the present invention to provide a method of ceramic fabrication in which the binder can be burned out in a time substantially shorter than the obtainable in prior art methods even though very low temperatures are used.

It is another object of the present invention to provided an improved technique for fabricating ceramic structures having conductors embedded therein wherein the dielectric constant of the ceramic is not adversely affected by the fabrication process.

SUMMARY OF THE INVENTION

The method of the present invention, in its broadest aspect, comprises forming a multi-layer ceramic composite structure with copper-based conductors therein, wherein binders in the green sheets forming the ceramic and in the paste forming the conductors are burned out in air.

The composite structure is formed from at least one green sheet comprised of a thermoplastic organic binder having dispersed within the binder glass particles or an admixture of glass and crystalline particles. The green sheet has a sintering temperature below the melting point of the copper-based metallurgy which forms conductors within the composite structure. On the surface of the green sheet is deposited a pattern of a copper based conductor forming composition. The predominant component of this composition is copper.

A second green sheet is superimposed on the surface of the first green sheet sandwiching the metal pattern between the first and second green sheets. A multi-layered structure can have any number of conducting layers and green sheet layers positioned between the conducting layers. The green sheets are laminated together. The laminated green sheets are then heated in an ambient of air to a burn-out temperature and maintained thereat for a time sufficient to decompose and eliminate the binders.

The burn-out temperature is not sufficient to cause a substantial change in the state of the green laminate and the copper-based conductors paste therein. An inert or reducing atmosphere is substituted for the air ambient. The laminate is then sintered to form the ceramic structure having at least one layer of copper-based conductors within the interior of the structure. For green sheets of glass particles sinterings includes heating to a temperature sufficient to coalesce the green laminate to a dense state and thereafter heating to crystallize the glass particles into a ceramic composite material. For green sheets of an admixture of glass particles and crystalline particles if no additional crystallization is required sintering is limited to heating to a temperature sufficient to coalesce the green laminate to a dense state to form the ceramic. If additional crystallization is required, the densified laminate is thereafter heated to crystallize glass particles to form the ceramic.

The copper based metallurgy used to form the conductor patterns is a combination of copper with an additive which provides oxidation resistance to the metallurgy during the heating of the laminate in air to burn out binders.

The additive is selected to maintain the resistivity of the metallurgy at a value less than about three times the resistivity of copper. The additive limits oxide formation on the conductor pattern to substantially prevent delamination and cracking of the green laminate during binder burn-out and sintering. Also, the dielectric constant of the fully sintered ceramic remains less than about 10.

The copper-based metallurgy can be metal based combinations such as an alloy of copper and the additive, or fine copper particles coated with the additive. Additives useful for practicing the present invention are zinc, platinum and chrome or a combination of these materials. Zinc is particularly effective to provide oxidation resistance to copper-based conductors during binder burn-out in air.

In accordance with a more particular aspect of the present invention, the conductor patterns within the multi-layered ceramic structure are extended to at least one surface of the structure. A semiconductor chip is mounted to this surface in electrical connection to at least a portion of the pattern extensions.

These and other objects, features and advantages will be apparent from the following more particular description of the preferred embodiments.

DETAILED DESCRIPTION OF THE PREFERRED EMBODIMENTS OF THE INVENTION

Figure 1:
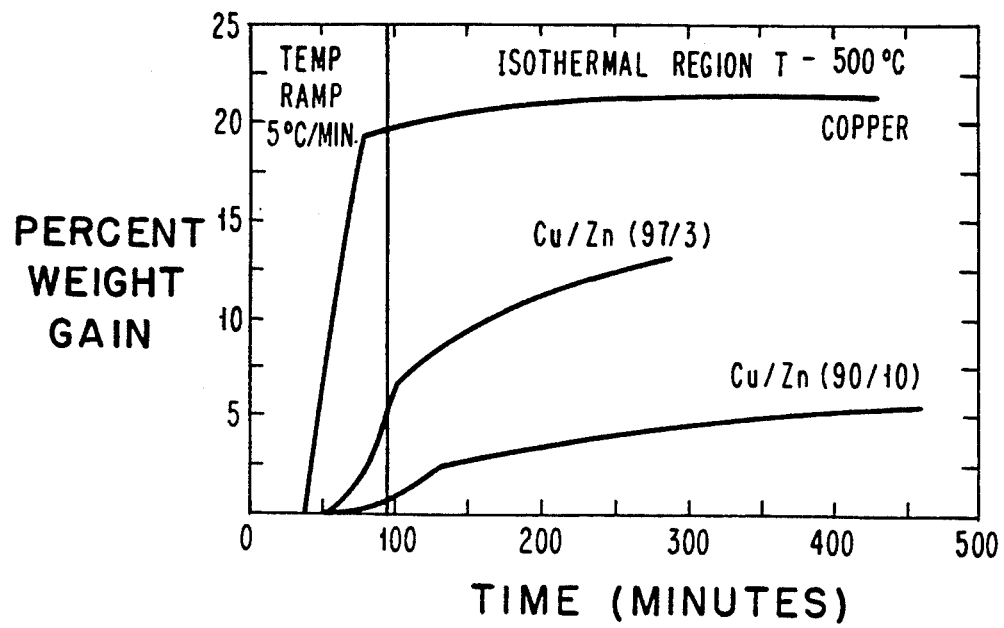
FIG. 1 is a graph illustrating thermogravimetric results for copper and copper-zinc alloys.

It was discovered, in accordance with this invention that binders in green sheets of glass particles or an admixture of glass and crystalline particles used to form a sintered ceramic article and binders in a copper-based paste used to form conductors within the sintered article can be burned out in an ambient of air while maintaining minimal and non-detrimental oxidation of the surface of the copper-based conductors. Copper in combination with additives such as zinc, platinum and chrome are more oxidation resistant main than untreated copper. Such combinations are used to form conductors within ceramic articles by the method of the present invention.

A ceramic composite structure formed by the method of the present invention is useful as a substrate on which a semiconductor chip is mounted to provide electrical connection of device and circuit elements on such semiconductor chip to a support structure, such as a printed circuit board to which the substrate is electrically connected.

The composite structure is formed from at least one green sheet, comprised of a thermoplastic organic binder having dispersed within the binder particles of a crystallizable glass or an admixture of glass particles and crystalline particles. Commonly used ceramic binders are Butvar (registered trademark of Monsanto Inc.), polyvinyl butyral and polyvinyl acetate. Such binders are exemplary only and not limiting. The sintering temperature of the green sheet is less than the melting point of the copper-based metallurgy which forms conductors within the composite structures. The sintering temperature of a green sheet composed of crystallizable glass particles is the crystallization temperature. The sintering temperature of an admixture of glass and crystalline particles is the coalescence temperature if no further crystallization is required or the crystallization temperature if further crystallization is required.

Examples of crystallizable glasses, useful for practicing the present invention, are disclosed in U.S. Pat. No. 4,301,324 to Kumar et al. and the process for making such ceramic structure is disclosed in U.S. Pat. No. 4,413,061 to Kumar et al. The teachings of both patents are incorporated herein by reference. The disclosed ceramic structures are characterized with low dielectric constants and are compatible with circuitry of copper-based metallurgy co-sinterable therewith. These glasses have crystallization temperature in the range of about 850° C. to 970° C.

Of the two types of ceramics disclosed in the aforesaid U.S. Pat. Nos. 4,301,324 and 4,413,061, one has spodumene, $Li_2O \cdot AL_2O_3 \cdot 4SiP_2$, as the principal crystalline phase while the other has cordierite, $2 MgO \cdot 2Al_2O_3 \cdot 5SiO_2$, as the principal crystalline phase. A common feature of these sintered ceramics, among others, is their excellent sinterability and crystallization below 1000° C.

The terms spodumene glass and cordierite glass as used herein refer to the uncoalesced and uncrystallized glass particles. The terms spodumene ceramic and cordierite ceramic as used herein refer to the coalesced and crystallized ceramic.

The multi-layered ceramic of the present invention includes, but is not limited to, the spodumene ceramics and cordierite ceramics as described in the Kumar et al. patents.

Examples of crystalline particles useful to form an admixture of glass and crystalline particles from which a ceramic can be formed are alumina, cordierite, spodumine, quartz, beta-eucryptite and aluminum nitride. These crystallites are exemplary only and not limiting. The glass particles contained in the admixture can be any glass, such as for example borosilicate glass, which will coalesce to a dense state to encapsulate the crystalline particles.

On the surface of the green sheet is deposited a pattern of a copper-based conductor forming composition which includes a copper paste binder, for example ethylcellulose. The predominant component of the composition is copper.

A second green sheet is superimposed on the first sheet to sandwich the conductor pattern therebetween. The sheets are laminated together. A multi-layered ceramic structure is formed by laminating green sheets alternately with patterns of copper-based paste between green sheets. Copper patterns separated by glass sheets are connected by through-holes or vias in the green sheets which are filled with the copper-based paste. For a ceramic structure for use as a semiconductor chip substrate, the copper pattern is extended to at least one surface of the composite structure.

The laminated structure is heated to the burn-out temperature in an ambient of air at a rate which does not disturb the integrity of the substrate. If burn-out is too rapid, plasticizers contained in the binder in the green sheets will come off too rapidly causing blisters and resulting in delamination of the green laminate. The laminate is maintained at the burn-out temperature for a sufficient time to decompose and eliminate the binders in the green sheets and copper-based paste. The temperature must not be high enough to melt the copper-based conductor pattern and must not be high enough to cause coalescence of the glass particles. A requirement for binder removal is that the ceramic body remain porous until all residues have been removed. If the glass particles in the green laminate begin to coalesce before the binders are burned-out, the products of the binder decomposition become trapped in the ceramic: (1) leaving carbon residues which increase the ceramic dielectric constant, (2) forming pores in the glass ceramic preventing its complete densification and (3) delaminating the green laminate if the pressure of the trapped products is great enough.

The predominant component of the copper based conductor is copper combined with an additive. Any additive which satisfies the following criteria is useful to practice the present invention. The additive is selected to maintain the resistivity of the copper-based metallurgy at a value less than about three times the resistivity of copper, which is about equal to the resistivity of molybdenum. Molybdenum is currently used in alumina multi-layered ceramic substrates and an improved conductor should have a resistivity less than that of molybdenum. The melting point of the metallurgy must remain greater than the sintering temperature of the green laminate. The additive must either prevent oxide formation at the surface of the metal forming the conductor pattern or limit oxide formation so as 1) not to cause substantial delamination of the green laminate, 2) not to cause cracks in the sintered ceramic and 3) to maintain the dielectric constant of the sintered ceramic less than that of alumina which is about 10.

Examples of additives useful to practice the present invention are zinc, platinum and chrome or a combination of these materials. These are exemplary only and not limiting. The copper-based conductor can be metal combinations such as an alloy of copper with an additive or fine copper particles of about 1 to 5 microns in size having a thin coating thereon of an additive. It has been found that zinc is a particularly unique additive to permit rapid binder burn-out in air by the method of the present invention.

For a conductor formed from additive coated copper particles, as the temperature is increased during binder burn-out and sintering, the additive combines or alloys with the copper. For zinc coated copper particles mixing begins about 420° C. The permitted range of coating thickness is determined by the copper particle size in such a way that after mixing the criteria of the proceeding paragraph are satisfied. For a sintered copper conductor with a zinc additive, to obtain a conductor resistivity of less than 6 micro-ohm-cms, a zinc content of less than 10 weight percent is required. For a copper particle size of about 2 microns, a zinc coating of about 886 angstroms thickness is required to obtain a 10 weight percent zinc content.

For convenience, the invention will be further described in terms of combinations of copper and zinc. However, it should be understood that the method is not limited to such combinations.

FIG. 1 shows thermogravimetric results from heating copper-zinc alloy powders in oxygen and heating substantially pure copper in oxygen. The change in weight of samples exposed to oxygen is measured. Sample weight gain is from oxide formation on the sample surface. At a typical binder burn-out heating rate of about 5° C per minute, copper is completely oxidized before 500° C is reached. On the other hand, for zinc alloy powders, the copper is protected from substantial oxidation. For 3% zinc alloy the gain in weight is less than 5% on reaching 500° C and for 10% zinc alloy the gain in weight is less than 5% even after 5 hours at 500° C.

On the other hand, the gain in weight of the pure copper is about 20% on reaching 500° C after one and a half hours. Since the copper-zinc alloy weight gain is less than that of pure copper, the alloy is less oxidized. The zinc content of the copper-zinc alloy affects its melting point and resistivity. As the zinc content increases the melting point decreases and the resistivity increases.

The zinc content can be increased to a point such that the copper-zinc alloy does not become molten at the sintering temperature of the green laminate in which the copper-zinc conductors are embedded. For example, for a ceramic substrate having a sintering temperature of about 950° C a copper-zinc alloy having about 25% zinc by weight will not be molten at such a temperature. The zinc content by weight has a lower bound such that the copper zinc conductor is not substantially oxidized during binder burn-out. Greater than about 3% of zinc by weight is generally necessary to satisfy this condition.

The substantially greater increase in weight of the pure copper is believed to occur because as the surface of the copper is oxidized, the resulting copper oxide surface layer cracks because of a substantial volume expansion on forming copper oxide. Such cracks permit oxygen to contact the unoxidized surface of the copper resulting in further oxide formation.

On exposure of a copper-based metallurgy with a zinc additive to an oxidizing atmosphere, such as air, it is believed that the zinc oxidizes to form a coating of zinc oxide, ZnO, on the surface of the conducting metal. The zinc oxide is believed to be more adherent to the surface than copper oxide and less likely to crack. Also, Zinc oxide formation proceeds more rapidly than copper oxide formation since it is thermodynamically more favorable. At the onset of the surface oxide formation, both copper and zinc oxidize to form oxide at the surface. The zinc oxide layer thickness increases more rapidly and substantially reduces the rate of transport of oxygen from the air ambient through the oxide to the unoxidized copper and zinc. This results in a substantial reduction in further thickening of the zinc oxide layer. It is believed that at the onset of the surface oxide formation the less adherent copper oxide diffuses into the ceramic. As the oxidation proceeds, the zinc oxide surface layer substantially limits further copper oxide formation and diffusion into the ceramic. Further heating in a reducing atmosphere of the subsequent step to sinter the green laminate of the green glass, reduces the surface metal oxide and the metal oxide which diffused into the ceramic to the metal state. The metal left in the ceramic increases the ceramic dielectric constant. Thus, the self limiting surface oxide formation prevents substantial change in the ceramic dielectric constant by limiting the extent of oxide diffusion into the ceramic.

Some additives, such as platinum, prevent oxidation of the copper-based conductor surface during binder burn-out. An additive, such as chrome, forms a self limiting surface oxide in a similar fashion to zinc.

Additives, such as zinc, which permit self limiting oxidation of the conductor surface are added at least in an amount which permits no more than about 15% volume increase of the copper-based conductor. Greater volume increase can cause cracks in the unsintered green laminate during binder burned-out. Such cracks generally do not heal on sintering. These cracks substantially reduce the strength of the sintered ceramic.

Structures containing twenty layers of spodumene or cordierite ceramic sheets laminated with metal planes of copper and copper-zinc alloy were burned out in air at 500° C. and 600° C. for up to six hours.

The results indicate that after a temperature ramp of 3.6° C. per minute to 500° C. the binder is completely burned out after one hour at 500° C. The binder is completely burned-out in about 3.3 hours On the other hand, substantial disruption of the laminate with copper planes was observed.

If these structures are then heated at a rate of about 1° C. to 5° C. per minute in a reducing atmosphere, such as forming gas (10% $H_2-N_2$) or a neutral atmosphere of nitrogen gas, to the ceramic sintering temperature, e.g. 950° C, and held there for two hours, the ceramic density achieve is about 99% of the theoretically calculated density. During this heating step, as noted above any oxide formed at the conductor surface is reduced. The oxygen is burned off and the metal constituent of the oxide is left in the ceramic increasing its dielectric constant. It is desirable to maintain the dielectric constant of the ceramic at a value less than that of alumina which is about 10. If there is too much surface oxide or if it is reduced to rapidly, the escape of oxygen can cause delamination of the laminated sheets.

Table 1 lists measured electrical resistivities of copper and copper-zinc conductors (by the commonly known four point probe method) and the distance the copper moves into the crystallized ceramic for these structures as a result of copper oxide diffusion.

TABLE I

| Properties of Air Burned-off Glass Ceramic/Cu Alloy | | | | | | | |
|---|---|---|---|---|---|---|---|
| Burn-off | | Sintering | | Ceramic | | Resistivity | Cu Diffusion in ceramic |
| Temp (°C.) | Time (Hr) | Temp (°C.) | Time (Hr) | Density | Metal | Micro ohm-Cm | (distance) |
| 500 | 1.0 | 960 | 2.0 | 2.59 | Cu-3% Zn | 4.35 | <2 microns |
| 500 | 1.0 | 960 | 2.0 | 2.59 | Cu-10% Zn | 5.40 | <2 microns |
| 500 | 1.0 | 960 | 2.0 | 2.59 | Cu | 3.43 | <2 mils |

Accordingly, a process has been developed to remove polymeric binders from ceramic/copper-based multi-layered substrates based on this concept. The process involves heating a laminated assembly of green ceramic layers, with an internal copper-based pattern of metal conductors therein in air to burn-out or depolymerize the binder without detrimental oxidation of the conductors. Further heating in a reducing atmosphere returns the oxidized metal to its metal state.

It is the preferred embodiment of the present invention to burn-out the binder in air at a rate of about 1° C. to 5° C. per minute to a burn-out temperature of from about 450° C. to about 600° C. at which even a low melting point glass such as borosilicate glass in a glass and crystallite admixture, can be used because it does not coalesce thereat. The laminate is held at this temperature, referred to herein as the hold temperature, for a time sufficient to burn-out the binder. The preferred green sheet forming the laminate contains crystallizable glass particles of cordierite or spodumene glass and the preferred conductor is copper with a zinc additive of from about 3% to about 25% by weight.

If the burn-out temperature is lower than about 450° C. the binder resin contained in the green sheet does not satisfactorily burn out. The upper bound of the binder burn-out temperature is set by the ceramic properties. The stacked layers of green sheets must be porous at the binder removal hold temperature to allow complete removal of the binders. If the hold temperature is too high, the glass particles will densify trapping binder residue. Examples of illustrations of ceramics used for the preferred embodiment of this invention are the spodumene and cordierite glass formulations disclosed in the aforesaid patents to Kumar et al. The crystallization temperatures of these ceramics are in the range of about 850° C. to about 970° C. In a second firing step the laminated multi-layered glass structure is heated preferably at a rate of about 1° C. to 5° C. per minute in a reducing or neutral atmosphere to the sintering temperature.

A fired composite structure of laminated multi-layer ceramic layers with metal planes therein for use as a circuit substrate has the metal pattern extended to at least one surface of the fired laminate. An integrated circuit semiconductor chip is mounted on the laminate in electrical connection with the metal extensions.

EXAMPLE

The multi-layered substrate fabrication process involves the following illustrative basic steps.

Step 1

The cullet of the chosen crystallizable glass of glass-formulation #12 disclosed in U.S. Pat. No. 4,301,324 to Kumar et al. having formulations by weight percent:

| | | | |
|---|---|---|---|
| $SiO_2$ | 52.5 | $P_2O_5$ | 1.5 |
| MgO | 22.0 | $B_2O_3$ | 0.5 |
| $Al_2O_3$ | 22.0 | $ZrO_2$ | 1.5 | is ground to average particle sizes in the range of 2 to 7 micrometers. The grinding can be done in two steps, a preliminary dry or wet grinding to 400 mesh particle size followed by further grinding with suitable organic binders and solvents until the average particle size is reduced to lie between 2 to 7 micrometers and a castable slurry or slip is obtained. A single stage prolonged grinding of the cullet in the medium of the binder and solvent, until the desired particles sizes are obtained can be used. In the latter case, a filtering step may be necessary to remove oversized particles.

By way of example, a suitable binder is polyvinylbutyral resin with a plasticizer such as dipropylglycoldibenzoate (e.g. The commercial Benzoflex plasticizer of the Tennessee Products and Chemical Corp). Other suitable polymers are polyvinyl acetate, selected ones of the acrylic resins, and the like. Similarly other suitable plasticizers such as dioctylphthalate, dibutyl phthalate, and the like, can also be used.

The purpose of adding an easily evaporable solvent is (1) to initially dissolve the binder so as to enable it to coat the individual glass particles, and (2) to adjust the rheology of the slip or slurry for good castability. A particularly effective solvent for the purpose of this example are the dual solvent systems of U.S. Pat. No. 4,104,245, specifically the dual methanol/-methyl isobutylketone (in a 5/8 weight ratio) solvent system.

Step 2

The slip or slurry prepared as in Step 1 is cast, in accordance with conventional techniques, into thin green sheets (e.g. about 750–250 micrometers (3–10 mils) thick), preferably by doctor-blading techniques.

Step 3

The cast sheets are blanked to the required dimensions and via holes are punched through them in the required configuration.

Step 4

A metallizing paste of copper-zinc alloy containing 5% zinc by weight is extruded or screened into the via holes in the individual sheets.

Step 5

A suitable copper-zinc alloy paste or ink is then screen-printed onto the individual green sheets of Step 4, in the required conductor patterns.

Step 6

A plurality of sheets, prepared as in Step 5, are laminated together in registry in a laminating press;

The temperature and pressure employed for lamination should be such as to cause (1) the individual green sheets to bond to each other to yield a monolithic green substrate, and (2) to cause the green sheet to sufficiently flow and enclose the conductor patterns.

Step 7

Firing of the laminate to the sintering temperatures to accomplish binder removal, densification or coalescence of the glass particles, and conversions to a glass-ceramic by crystallization with concurrent sintering of the metal particles, in the conductor patterns, the dense copper-zinc lines and vias.

Figure 2:
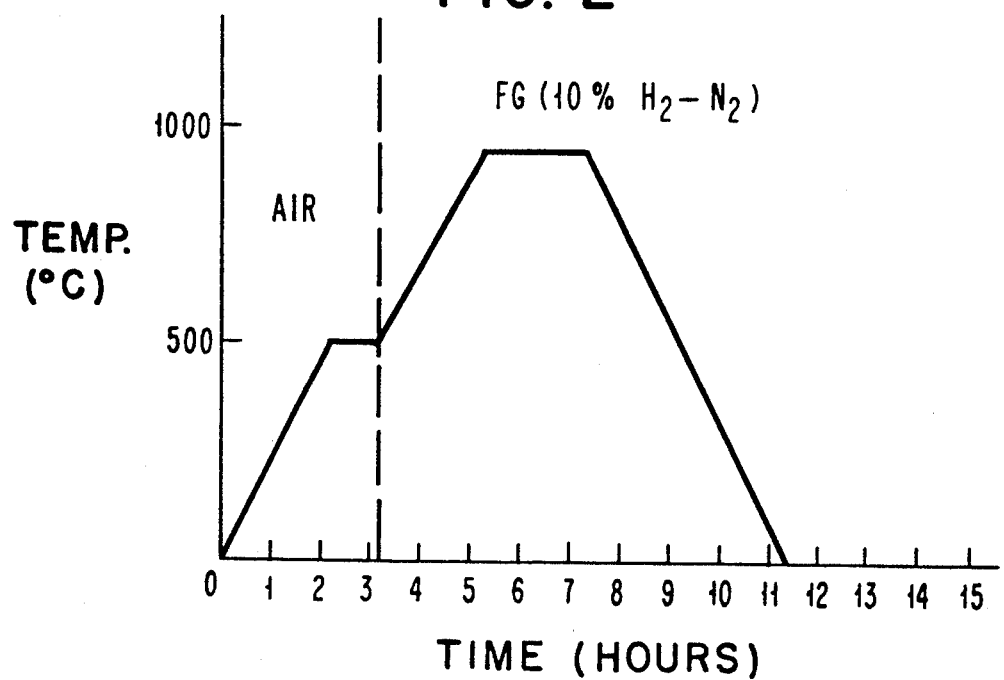
FIG. 2 is a curve showing a firing schedule in accordance with one embodiment of this invention.

A typical firing schedule is shown in FIG. 2 For this example, the green laminate is heated at a rate of 3.6° C./min. in air to a hold temperature of 500° C. The laminate is held at this temperature for about one hour. The air ambient is switched to a forming gas (10% $H_2-N_2$) ambient at which point the heating is again elevated at a rate of 3.8° C./min. to the crystallization temperature of the glass (e.g. about 960° C. for the glass #12), which temperature is held for about 2 hours, after which the temperature is reduced to ambient at a rate of about 3.8° C./min.

While the invention has been illustrated and described with respect to preferred embodiments, it is to be understood that the invention is not limited to the precise constructions herein disclosed, and the right is reserved to all changes and modifications coming within the scope of the invention as defined in the appended claims.

Having thus described the invention, what is claimed as new and desired to be secured by Letters Patent is:

1. A method for forming a ceramic composite structure with copper based conductors comprising:
    forming at least two green sheets comprised of a thermoplastic organic binder having dispersed therein particles selected from the group consisting of particles of a crystallizable glass and an admixture of glass particles and crystalline particles, said green sheet having a sintering temperature below the melting point of said copper based conductors;

forming on a surface of one of said at least two green sheets a pattern of a copper based conductors forming composition wherein the predominant component of said composition is copper based particles containing an additive within said copper based particles and wherein said composition is resistant to oxidation during the subsequent burn out of said thermoplastic organic binder;

superimposing the other of said at least two green sheets on said surface of said one of said at least two green sheets to sandwich said pattern therebetween;

laminating said superimposed sheets together;

heating said laminate in an oxidizing ambient to a burn-out temperature and maintaining said laminate thereat for sufficient time to decompose and eliminate said binder without substantial oxidation of said index forming composition; and sintering said laminate in a reducing or inert atmosphere to form a ceramic structure having said copper bead conductors extending within the interior thereof.

2. The method of claim 1, wherein said oxidation resistant copper based conductor is a combination of copper with an additive which provides oxidation resistance to said conductor during heating of said laminate in said oxidizing ambient, said copper based conductor having resistivity less than about three times the resistivity of substantially pure copper and wherein said oxidation resistance limits oxide formation on said conductor during said heating in air to substantially prevent delamination and cracking of said laminate, the dielectric constant of said ceramic remaining less than about 10.

3. The method of claim 2, wherein said additive is selected from the group consisting of one or more of zinc, platinum and chrome.

4. The method of claim 2, wherein said combination is an alloy of copper and said additive.

5. The method of claim 4, wherein said additive is zinc.

6. The method of claim 5, wherein said copper-based conductor contains zinc from between about 3 to about 25 weight percent.

7. The method of claim 2, wherein said combination consists of a distribution of fine copper particles coated with a thin layer of said additive.

8. The method of claim 2, wherein said laminate is heated to a burn-out temperature in the range of about 450° C. to about 600° C.

9. The method of claim 8, wherein said laminate is heated to said burn-out temperature at a rate of about 1° C. to 5° C. per minute and held at the burnout temperature for less than about 4 hours.

10. The method of claim 1, wherein said crystallizable glass is selected from the group consisting of spodumene glass, cordierite glass, lead glass and borosilicate glass.

11. The method of claim 1, wherein said admixture contains crystalline particle selected from the group consisting of one or more of alumina, cordierite spodumine, quartz, beta-eucryptite and aluminum nitride.

12. The method of claim 1, including providing means for extending said pattern to at least one surface of said fired laminate.

13. The method of claim 12, including mounting an integrated semiconductor chip on said surface in electrical connection to a portion of said pattern extension.

14. A method for forming a glass ceramic composite structure with copper based conductors comprising:

forming a multilayered structure having layers of patterns of a copper-based conductor forming composition, there being at least between adjacent layers of said patterns green sheets comprised of a thermoplastic organic binder having dispersed therein particles selected from the group consisting of particles of a crystallizable glass and an admixture of glass particles and crystalline particles, said green sheet having a sintering temperature below the melting point of said copper based conductors, at least some of said green sheets between said adjacent layers of patterns having through holes of said copper-based conductor forming composition therein for electrically interconnecting said adjacent layers of patterns, the predominant component of said composition is copper and said composition is resistant to oxidation during the subsequent burn out of said binders;

said copper based conductor forming composition containing copper based particles containing an additive within said particles;

laminating said multilayered structure together;

heating said laminate in an oxidizing to a burn-out temperature and maintaining thereat at for sufficient time to decompose and eliminate said binder without substantial oxidation conductor forming composition;

sintering said laminate to form a ceramic structure having said copper based conductors extending within the interior thereof.

15. A method for forming a ceramic composite structure with copper based conductors comprising:

forming at least two green sheets comprised of a thermoplastic organic binder having dispersed therein particles selected from the group consisting of particles of a crystallizable glass and an admixture of glass particles and crystalline particles, said green sheet having a sintering temperature below the melting point of said copper based conductors;

forming on a surface of one of said least two green sheets a pattern of a copper based conductor forming composition wherein the predominant component of said composition is copper based particles coated with an inorganic material and wherein said composition is resistant to oxidation during the subsequent burn out of said thermoplastic organic binder;

superimposing the other of said at least two green sheets on said surface of said one of said at least two green sheets to sandwich said pattern therebetween;

laminating said superimposed sheets together;

heating said laminate in an oxidizing ambient of to a burn-out temperature and maintaining said laminate thereat for sufficient time to decompose and eliminate said binder without substantial oxidation of said index forming composition; and sintering said laminate in a reducing or inert atmosphere to form a ceramic structure having said copper based conductors extending within the interior thereof.

16. The method of claim 7, wherein said copper particle size is from about 1 to about 5 microns.

17. The method of claim 16, wherein said additive is a layer of zinc on said copper particles of a thickness which results in a copper-zinc combination of from between about 3 to about 25 weight percent zinc.

18. The method of claim 7, wherein said additive is zinc.

* * * * *